United States Patent
Reber et al.

(10) Patent No.: US 10,038,081 B1
(45) Date of Patent: Jul. 31, 2018

(54) SUBSTRATE CONTACTS FOR A TRANSISTOR

(71) Applicant: NXP USA, INC., Austin, TX (US)

(72) Inventors: Douglas Michael Reber, Austin, TX (US); Mehul Shroff, Austin, TX (US)

(73) Assignee: NXP USA, INC., Austin, TX (US)

(*) Notice: Subject to any disclaimer, the term of this patent is extended or adjusted under 35 U.S.C. 154(b) by 9 days.

(21) Appl. No.: 15/696,387

(22) Filed: Sep. 6, 2017

(51) Int. Cl.
*H01L 21/336* (2006.01)
*H01L 29/66* (2006.01)
*H01L 21/768* (2006.01)

(52) U.S. Cl.
CPC .. *H01L 29/66795* (2013.01); *H01L 21/76897* (2013.01); *H01L 29/6656* (2013.01); *H01L 29/66545* (2013.01)

(58) Field of Classification Search
None
See application file for complete search history.

(56) References Cited

U.S. PATENT DOCUMENTS

| | | | |
|---|---|---|---|
| 5,406,123 | A | 4/1995 | Narayan |
| 6,555,915 | B1 | 4/2003 | Reber |
| 6,797,622 | B2 | 9/2004 | Brask et al. |
| 7,339,241 | B2 | 3/2008 | Orlowski et al. |
| 7,863,123 | B2 | 1/2011 | Bu et al. |
| 2018/0096995 | A1* | 4/2018 | Ye .................. H01L 27/0886 |

OTHER PUBLICATIONS http://electroiq.com/blog/2009/12/hkmg_-gate-first_vs/, "IEDM 2009: HKMG gate-first vs gate-last options", 2009.
https://en.wikipedia.org/wiki/Ohmic_contact, "Ohmic contact", edited Mar. 5, 2017.
http://semimd.com/hars/2013/05/15/guest-blog-by-ibm-finfet-isolation-%e2%80%93-bulk-vs-soi/, "FinFET Isolation: Bulk vs. SOI", downloaded Aug. 10, 2017.

(Continued)

*Primary Examiner* — Thien F Tran
(74) *Attorney, Agent, or Firm* — David G. Dolezal

(57) ABSTRACT

In some embodiments, a substrate contact is formed by forming a first gate structure and a second gate structure. The first gate structure is formed in a first volume in a first area of the wafer and the second gate structure is formed in a second volume in a second area of the wafer. The gate dielectric is removed from the wafer in a first area of the wafer but remains in the second area. A first sidewall spacer formed for the gate structure and a second sidewall spacer is formed for the second gate structure. In some embodiments, the first gate structure can be utilized as a substrate contact and the second gate structure can be utilized as a gate of a transistor. In other embodiments, the first gate structure and the second gate structure can be removed and a metal gate material can be deposited in opening for forming a substrate contact and a metal gate, respectively. In some embodiments, the first gate structure (or the replacement metal gate structure) can be used as part of a body contact to bias the body of a transistor. In other embodiments, the first gate structure (or replacement metal gate structure) can be used as part of a current terminal contact for the transistor.

20 Claims, 19 Drawing Sheets

(56) References Cited

OTHER PUBLICATIONS

Eassa, A., "Intel Corporation Details 10-Nano Technology", https://www.fool.com/investing/2017/03/29/intel-corporation-details-10-nano-technology.aspx, Mar. 29, 2017.
Finetti, M., "Schottky barrier height of sputtered TiN contacts on silicon", Solid-State Electronics vol. 27, Issue 7, pp. 617-623, Jul. 1984.
Geun-Myeong, K., "The effect of Al content on the work function engineering at TiAlN/HfO2 interface", abstract #A8.006, APS March Meeting 2015.
Gupta, S., "7-nm FinFET CMOS Design Enabled by Stress Engineering Using Si, Ge, and Sn", IEEE Transactions on Electron Devices, vol. 61, No. 5, May 2014.
James, D., "Leading Edge Silicon Devices", Chipworks, Inc., 2015.
Kawa, J., "DesignWare Technical Bulletin", Synopsys, Inc., https://www.synopsys.com/designware-ip/technical-bulletin/finfet-design.html, downloaded Aug. 10, 2017.
Lawrence, B., "Review of Fin FET Technology and Circuit Design Challenges", Int. Journal of Engineering Research and Applications, ISSN: 2248-9622, vol. 5, Issue 12, (Part-1), pp. 77-80, Dec. 2015.
Maenpaa, M., "Contact resistivities of sputtered TiN and TiiTiN metallizations on solar-cell-type-silicon", https://doi.org/10.1016/0038-092X(81)90060-8Get rights and content, 1981.
Moyer, B., "Gate First vs. Last", Electronic Engineering Journal, http://www.eejournal.com/article/20111114-gate/, Nov. 14, 2011.
Murata, H., "Tuning of threshold voltage of organic field-effect transistors by space charge polarization", Applied Physics Letters, Mar. 2009.
Saraswat, K., "Polycides, Salicides and Metals Gates", Department of Electrical Engineering, Stanford University, 2016.
Shoeb, J., "Mechanisms for plasma etching of HfO2 gate stacks with Si selectivity and photoresist trimming", J. Vac. Sci, Technol. A27(6), Nov./Dec. 2009.
Stavitski, N., "Silicide-to-Silicon Specific Contact Resistance Characterization", University of Twente, The Netherlands, ISBN: 978-90-365-2937-2, 2009.
Wagner, M., "The Use of HBr in Polysilicon Etching", Gases & Instrumentation International, vol. 7, Issue 4., www.gasesmag.com, Jul./Aug. 2013.
Wittmer, M., "Electrical characteristics of TiN contacts to N silicon", Journal of Applied Physics, Aug. 1998.
Wittmer, M., "Applications of Tin Thin Films in Silicon Device Technology", Materials Research Society 1982.
Xu, N., "Aggressively Scaled FinFETs: the Effectiveness of Process-induced Strain (FinStrain)", Berkeley Electrical Engineering and Computer Sciences, https://www2.eecs.berkeley.edu/Research/Projects/Data/107107.html, downloaded Aug. 10, 2017.

\* cited by examiner

US 10,038,081 B1

SUBSTRATE CONTACTS FOR A TRANSISTOR

BACKGROUND OF THE INVENTION

Field of the Invention

This invention relates in general to transistors and more specifically to substrate contacts for transistors.

Description of the Related Art

Integrated circuits include transistors and contact structures for regions in the substrate of the integrated circuit.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

In some embodiments, a substrate contact is formed by forming a first gate structure and a second gate structure. The first gate structure is formed in a first volume in a first area of the wafer and the second gate structure is formed in a second volume in a second area of the wafer. The gate dielectric is removed from the wafer in a first area of the wafer but remains in the second area. A first sidewall spacer is formed for the first gate structure and a second sidewall spacer is formed for the second gate structure. In some embodiments, the first gate structure can be utilized as a substrate contact and the second gate structure can be utilized as a gate of a transistor. In other embodiments, the first gate structure and the second gate structure can be removed and a metal gate material can be deposited in the openings for forming a substrate contact and a metal gate, respectively. In some embodiments, the first gate structure (or the replacement metal gate structure) can be used as part of a body contact to bias the body of a transistor. In other embodiments, the first gate structure (or replacement metal gate structure) can be used as part of a current terminal contact for the transistor.

Providing such methods for forming a substrate contact for a transistor may enable a contact to be formed from a gate structure. With some embodiments, this may allow for a more compact integrated circuit in that the substrate contacts can be formed from structures used for improving lithographic processes at smaller nodes. With some smaller nodes, proximity (dummy) gate structures are utilized for improved semiconductor processing steps such as to stabilize device printing, to improve chemical mechanical (CMP) polishing uniformity, and to improve electrical characteristics. With the processes, structures, and/or features described herein, proximity gate structures can be utilized for substrate contacts, thereby allowing for, in some embodiments, the reduction in area of an integrated circuit in that extra areas are not needed for both proximity gate structures and substrate contacts.

Figure 1:
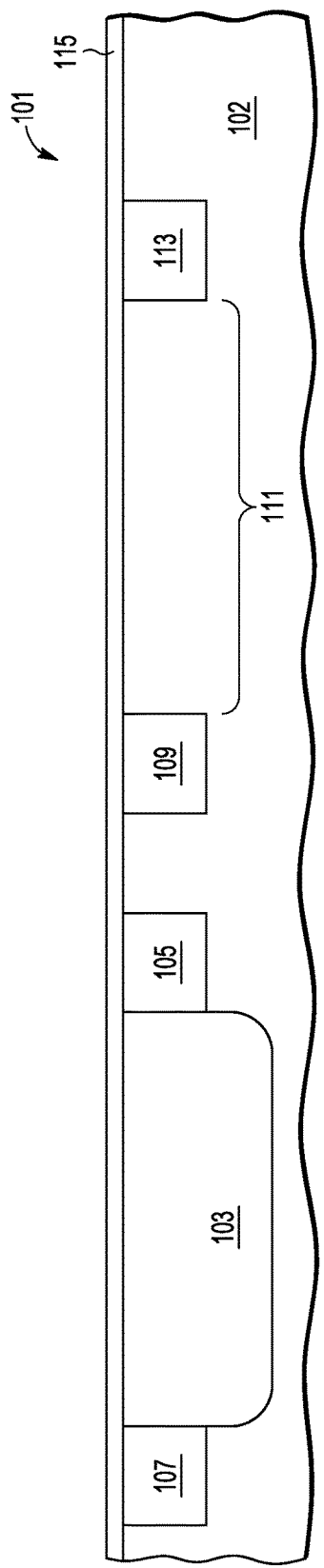
FIGS. 1-7 are partial cross-sectional side views of a wafer at various stages during the manufacture of a transistor according to one embodiment of the present invention.

FIG. 1 is a cutaway side view of a wafer 101 during a stage in the manufacture according to one embodiment of the present invention. Wafer 101 includes a substrate 102 that has a generally planar surface on which a layer 115 of gate dielectric material is formed. In one embodiment, layer 115 is made of silicon oxide or a high-K dielectric such as hafnium oxide, zirconium oxide, or titanium oxide. In some embodiments layer 115 is made of multiple layers of different dielectric materials (e.g. silicon oxide, silicon nitride, a high-K dielectric material). In one embodiment, layer 115 has a thickness in the range of 10 to 50 angstroms, but may have other thicknesses in other embodiments.

In some embodiments, substrate 102 is made of a semiconductor material such as silicon, silicon germanium, silicon carbon, gallium, gallium nitride, a III-V semiconductor material, other semiconductor material, or a semiconductor material that is a combination thereof. Substrate 102 may have a bulk semiconductor configuration or may have a semiconductor on insulator (SOI) configuration.

Prior to the formation of layer 115, trench isolation structures 105, 107, 109, and 113 are formed in substrate 102 to isolate the devices subsequently formed in wafer 101. In one embodiment, the insolation structures are made of oxide and are formed by forming openings in substrate 102 and depositing an oxide material. However, isolation structures maybe made by other processes in other embodiments.

After forming the isolation structures, substrate 102 is selectively implanted with dopants to form body regions (e.g. 103). In one embodiment where an N-Channel transistor will be formed, region 103 is doped with P-type dopants (e.g. Boron). In other embodiments where P-channel transistors are to be formed, substrate 102 can be selectively implanted with N-type dopants (e.g. phosphorus, arsenic). In one embodiment, the dopants are selectively implanted by forming a patterned mask (not shown) with openings corresponding to the regions for the desired dopants.

Figure 2:
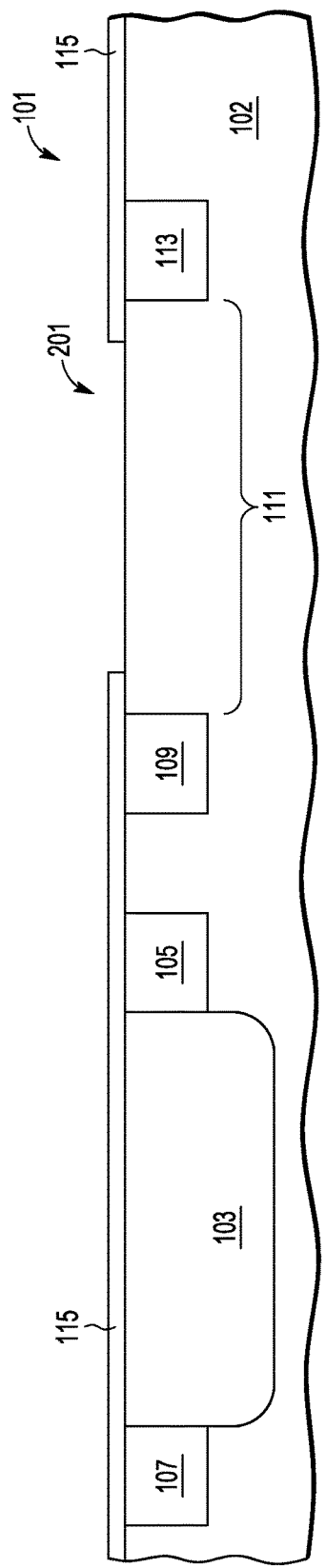

FIG. 2 shows a partial cutaway side view of wafer 101 after a portion of layer 115 is removed in area 111 of wafer 101 to form an opening 201 to expose substrate 102. In one embodiment, the opening in layer 115 is formed by forming a patterned mask over wafer 101 (e.g. of photoresist or other masking material) and etching the exposed portion of layer 115 with an etchant having a chemistry (e.g. hydrofluoric acid) to remove the dielectric material of layer 115. In other embodiments, layer 115 may be removed by other processes such as by a focused ion beam etch.

Figure 3:
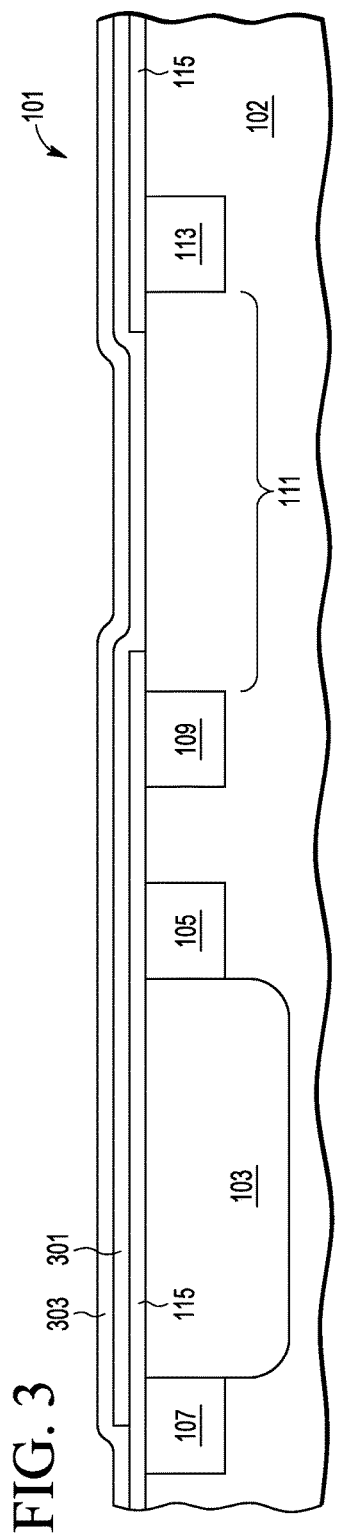

FIG. 3 shows a partial cutaway side view of wafer 101 after layers 301 and 303 of work function-adjusting metal materials are formed on wafer 101. In one embodiment, layer 301 is made of a material (e.g. TiAlN) that will adjust the work function of a subsequently formed N-channel transistor. In one embodiment, layer 301 has a thickness in the range of 20-50 Angstroms, but may have other thicknesses in other embodiments. Layer 301 is patterned to remove the portions of layer 301 that are in areas (not shown) where P-channel transistors will be formed.

After the patterning of layer 301, layer 303 is formed over layer 301. In one embodiment, layer 303 is made of a material (e.g. TiN) to adjust the work function of a P-channel transistor. In one embodiment, layer 303 has a thickness in the range of 10-50 Angstroms, but may have other thicknesses in other embodiments. In the embodiment shown, layer 303 is not patterned, but may be patterned in other embodiments. In some embodiments, layer 303 can be formed prior to layer 301. Some embodiments may not include a work function-adjustment layer for either the N-channel transistor or P-channel transistor. Other work function adjustment layers might include TaN, TaSi, TaSiN, TiSiN or a combination thereof.

Figure 4:
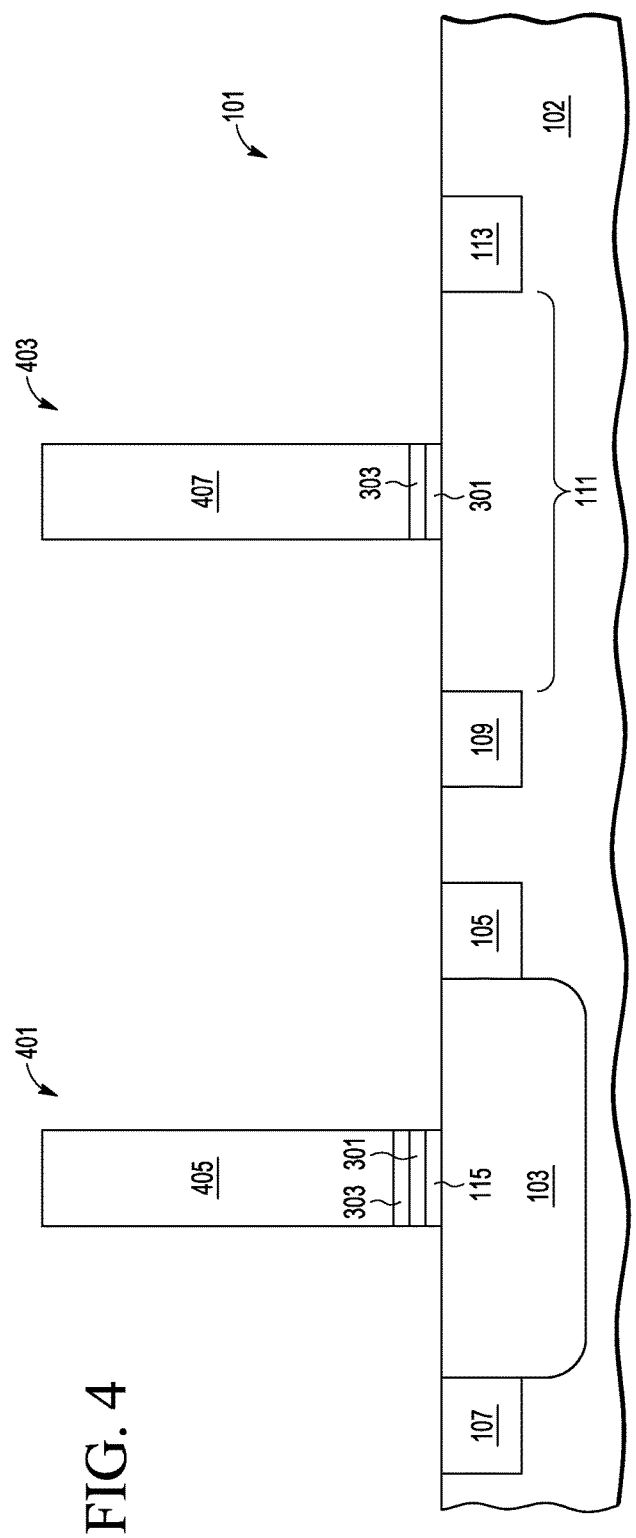

FIG. 4 shows a partial cutaway side view of wafer 101 after a layer of gate material (e.g. doped polysilicon) is formed over substrate 102 and is patterned to form gate structure 405 and gate structure 407. In one embodiment, the layer of gate material has a thickness in the range of 200-2000 Angstroms, but may have other thicknesses in other embodiments. Gate structures 405 and 407 have a width in that range of 7 nm to 90 nm, but may have other widths in other embodiments. In one embodiment, the gate material is patterned by forming a patterned mask (e.g. photoresist) and then etching the gate material with an etchant (e.g. a dry etch with $HBr/Cl_2/O_2$, $HBr/O_2$, or $BCl_3/Cl$) that is selective to etch the gate material (poly silicon) but not the mask material or the material of layer 303. In the embodiment shown, layers 303, 301, and 115 are also etched according to the pattern with the appropriate etch chemistries such that substrate 102 is exposed outside of stacks 401 and 403. In other embodiments, layer 115 is not etched at this stage, but may be etched during subsequent processing.

Figure 5:
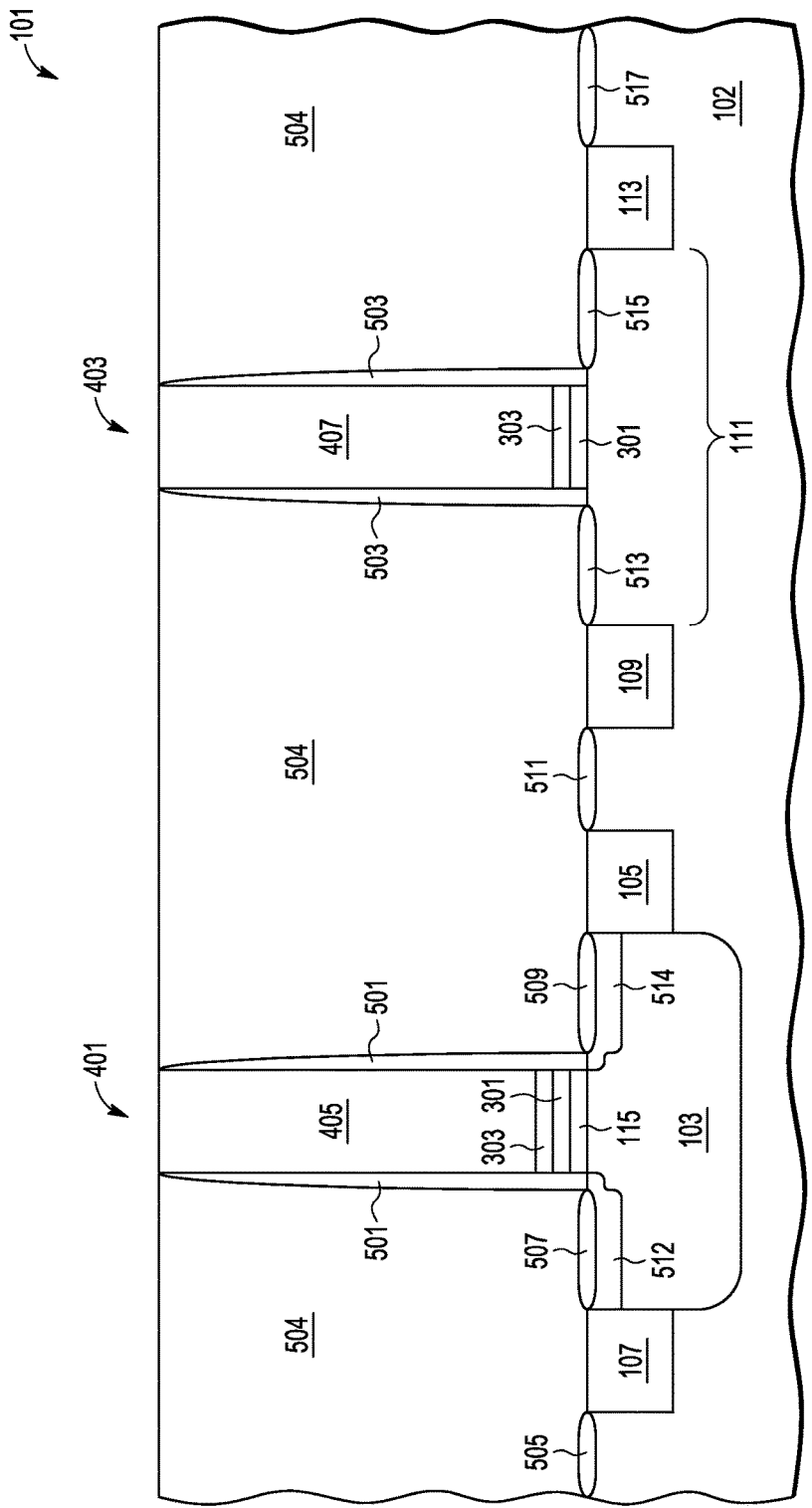

FIG. 5 is a partial cutaway side view of wafer 101 after a subsequent stage in its manufacture. After the stage of FIG. 4, sidewall spacers 501 and 503 are formed for gate structures 405 and 407, respectively. In one embodiment, spacers 501 and 503 are formed by forming a layer of spacer material (e.g. nitride, silicon oxide, silicon oxy-nitride, or combinations thereof in multiple layers) over the existing portions of wafer 101 and then subjecting the wafer to an anisotropic etch. Current terminal dopants are then implanted into wafer 101 to form source and drain regions 512 and 514. In one example, the dopants are implanted in one or more ion implantation steps. In some embodiments, some current terminal dopants maybe implanted prior to forming spacers 501 and 503. Afterwards, the exposed portions of substrate 102 are subjected to a silicidation process to form silicide structures 505, 507, 509, 511, 513, 515, and 517. In some embodiments, gate structures 405 and 407 may be blocked by a dielectric hard mask during the silicidation process. In other embodiments, structures 405 and 407 may also be silicided during the silicidation process. A layer 504 of dielectric material (e.g. an oxide formed by a TEOS process) is then formed on wafer 101, wherein wafer 101 is planarized to expose the top surfaces of gate structures 405 and 407.

Figure 6:
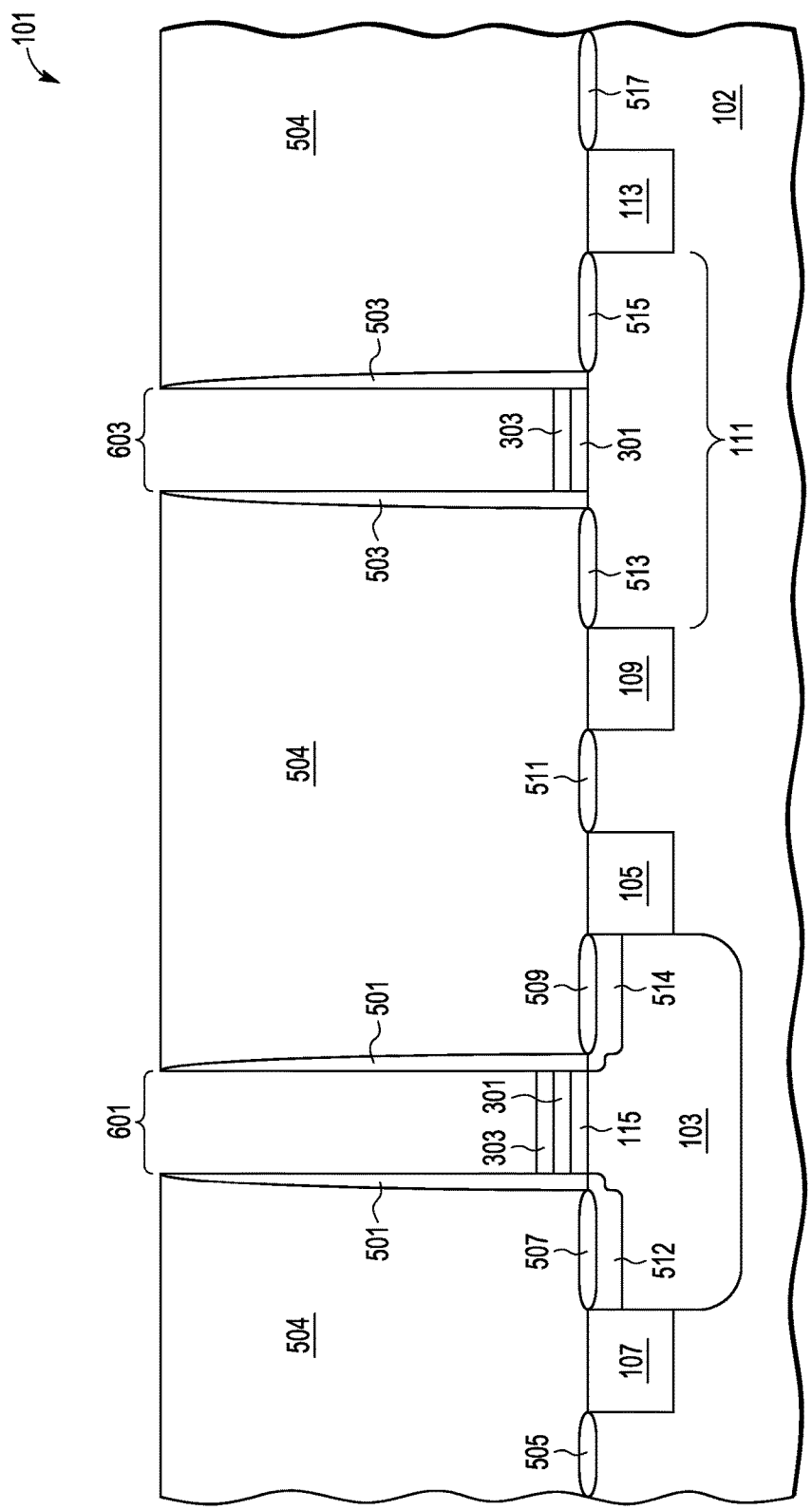

FIG. 6 is a partial cutaway side view of wafer 101 after gate structures 405 and 407 are removed to create openings 601 and 603. In one embodiment, structures 405 and 407 are removed by etching. As shown in the embodiment of FIG. 6, the removal of structures 405 and 407 exposes layer 303 in the openings.

Figure 7:
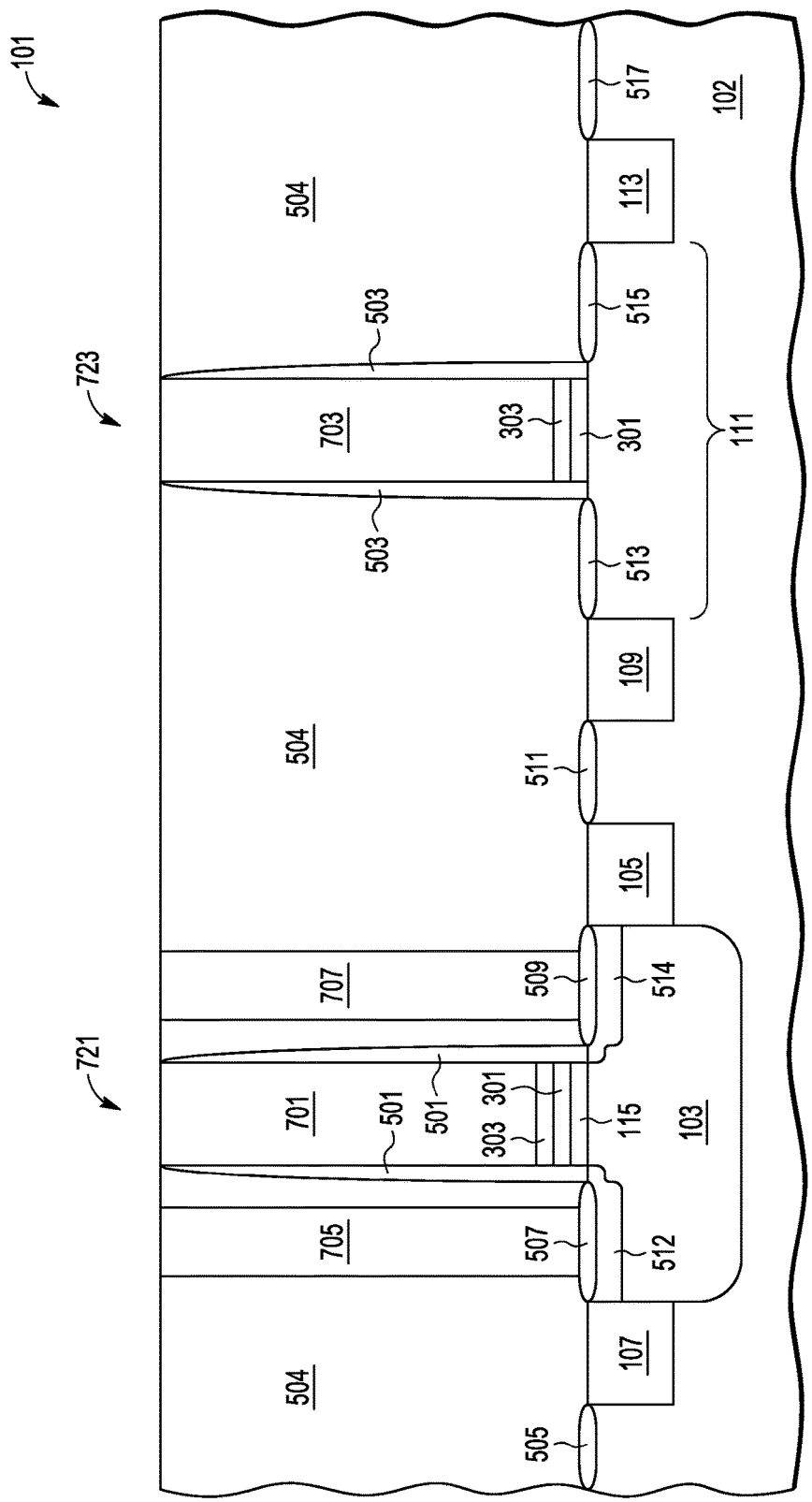

FIG. 7 shows a partial cutaway side view of wafer 101 after metal replacement gate structure 701 and contact structure 703 are formed in the volumes of wafer 101 of openings 601 and 603, respectively. In one embodiment, the metal of structures 701 and 703 is aluminum, but they may be made of other metal materials in other embodiments (e.g. Al, Cu, W, Ni, or combinations thereof). In some embodiments, the metal structures may include barrier films. In one embodiment, the metal of structures 701 and 703 is deposited by an atomic layer deposition (ALD) process but may be deposited by other processes in other embodiments. After the deposition of the metal of structures 701 and 703, the metal is planarized over layer 504 to remove the excess metal.

In the embodiment of FIG. 7, current terminal contacts 705 and 707 are formed in layer 504 to contact silicide structures 507 and 509, respectively. In one embodiment, contacts 705 and 707 are made of the same material and formed at the same time as structures 701 and 703, but may be formed of different materials and/or during different processing steps in different embodiments.

After the stage of FIG. 7, other structures and features (not shown) are formed on wafer 101 such as additional interconnect layers, dielectric layers, and external terminals (e.g. bond pads, posts). Afterwards, the wafer is singulated into multiple integrated circuits, each with at least one transistor and substrate contact similar to transistor 721 and contact 723, respectively. Also, in some embodiments, each integrated circuit may include other semiconductor devices (e.g. other N-channel transistors, P-Channel transistors, diodes, capacitors, resistors etc.). The integrated circuits can be packaged in various configurations to be utilized in electronic systems such as computers, cellular phones, and automobile control systems.

Figure 8:
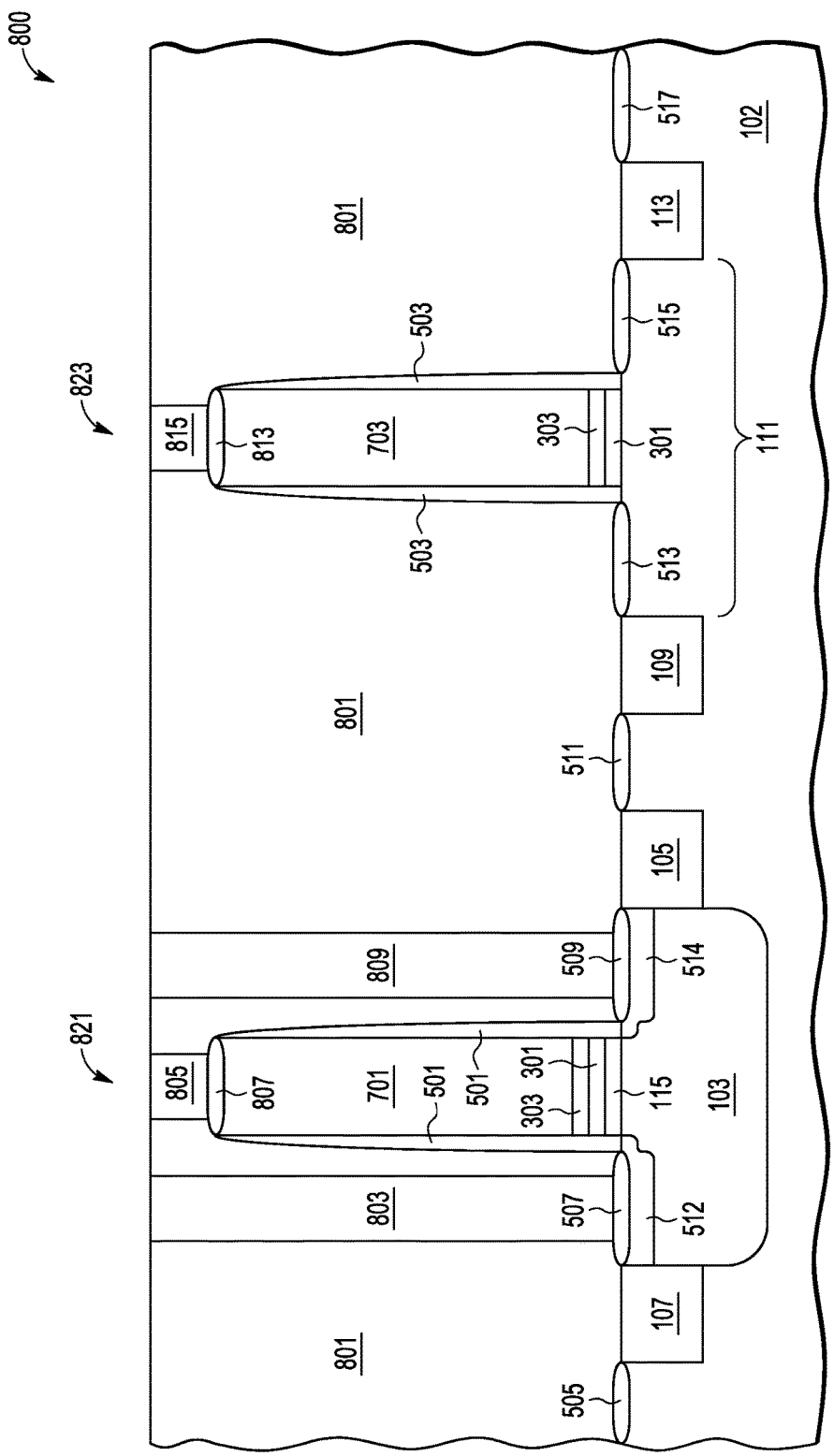
FIG. 8 is a partial cross-sectional side view of a wafer at a stage during the manufacture of a transistor according to another embodiment of the present invention.

FIG. 8 shows a partial cutaway side view of a wafer 800 according to another embodiment of the present invention. The embodiment of FIG. 8 is similar to the embodiment of FIG. 7 except that instead of implementing replacement metal gates, the gate of transistor 821 utilizes the polysilicon gate structure 405 and contact 823 utilizes polysilicon gate structure 407. The structures of the embodiments of FIGS. 7 and 8 having the same numbers are similar to each other and can be formed in a similar manner. Since there is no replacement metal in the embodiment of FIG. 8, dielectric layer 801 is not planarized down to the top of gate structures 405 and 407 and accordingly, silicide structures 807 and 813 formed on gate structures 405 and 407, respectfully, are not removed. Contacts 803, 805, 809 and 815 are formed in layer 801 to contact silicide structures 507, 807, 509, and 813 respectively. In some embodiments, gate contact 805 may be placed over the field region away from the transistor 821.

FIGS. 9-13 are partial cutaway side views of another embodiment according the present invention. The structures in the embodiments of FIGS. 1-7 and FIGS. 9-13 having the same numbers are similar structures and can be formed in a similar manner. In the embodiment of FIGS. 9-13, the portion of the gate dielectric layer 901 located in the area 111 of the subsequently formed substrate contact is not removed until after the formation of the polysilicon gate structure (1003 in FIG. 10).

Figure 9:
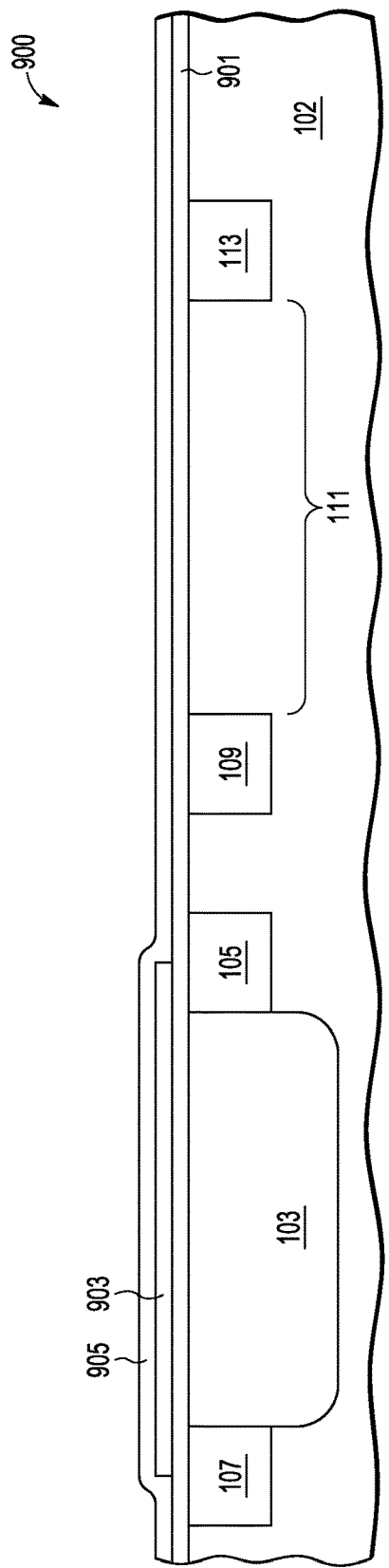
FIGS. 9-13 are partial cross-sectional side views of a wafer at various stages during the manufacture of a transistor according to another embodiment of the present invention.

In the embodiment shown in FIG. 9, gate dielectric layer 901 is formed on substrate 102. Afterwards, N-channel work function adjust layer 903 is formed and patterned to remain over region 103, and then P-channel work function layer 905 is formed over substrate 102.

Figure 10:
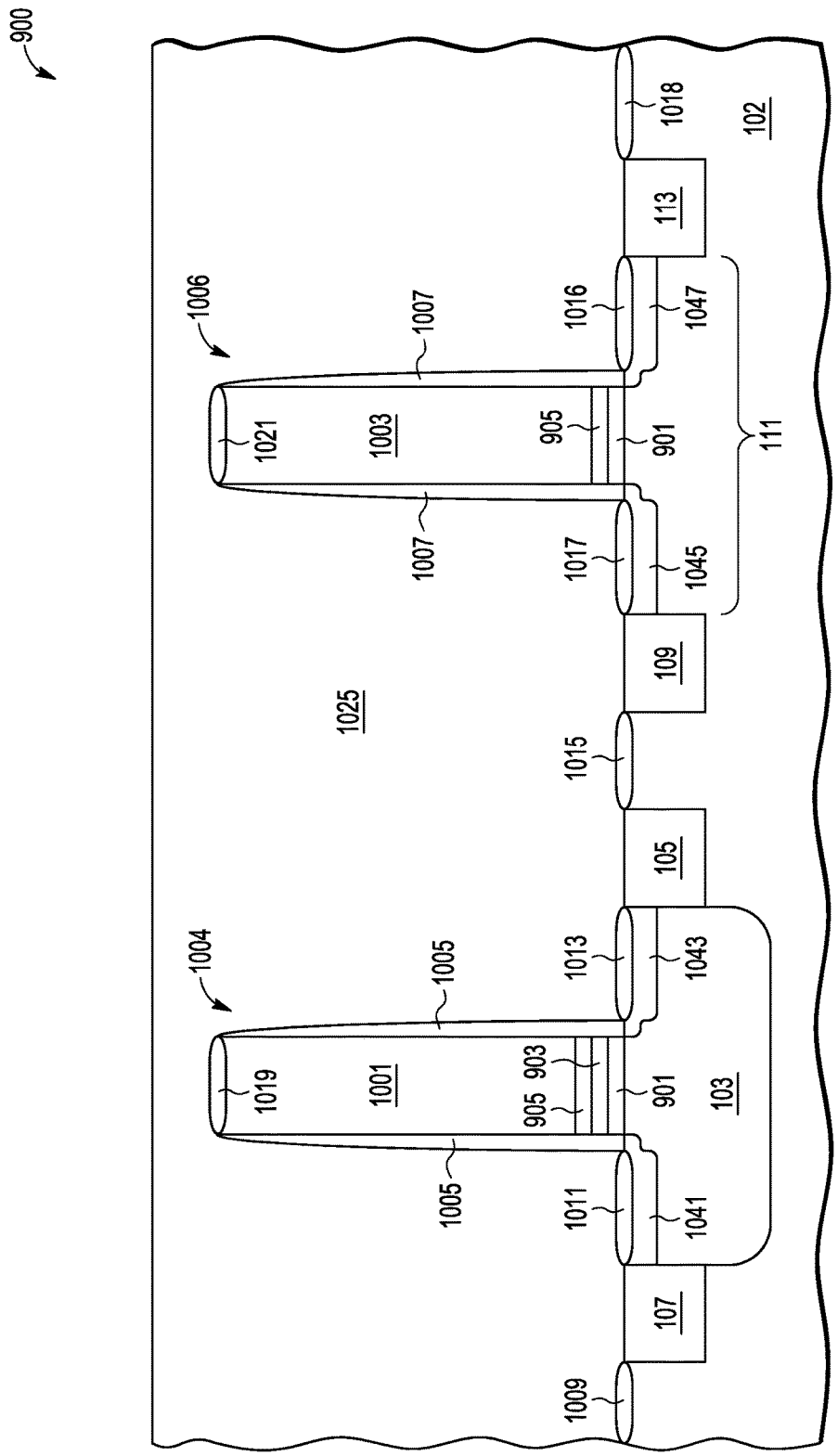

FIG. 10 shows wafer 900 after polysilicon gate structures 1001 and 1003 are formed, spacer 1005 is formed for gate structure 1001, and spacer 1007 is formed for structure 1003. In one embodiment, gate structures 1001 and 1003 are formed by forming a layer of polysilicon over layer 905 and patterning the layer of polysilicon along with layers 905, 903, and 901 to form stacks 1004 and 1006. Afterwards, spacers 1005 and 1007 are formed. After the formation of spacers 1005 and 1007, silicide structures 1009, 1011, 1019, 1013, 1015, 1017, 1021, 1016, and 1018 are formed by a silicidation of exposed silicon areas. A layer 1025 of interlayer dielectric material (e.g. an oxide formed by a TEOS process) is formed over wafer 900. Also, shown in FIG. 10 are source and drain regions 1041 and 1043 (current terminal regions) that are formed by implanting dopants (e.g. N-type dopants for an N-channel transistor) in substrate 102. At this time, regions 1045 and 1047 are also formed.

Figure 11:
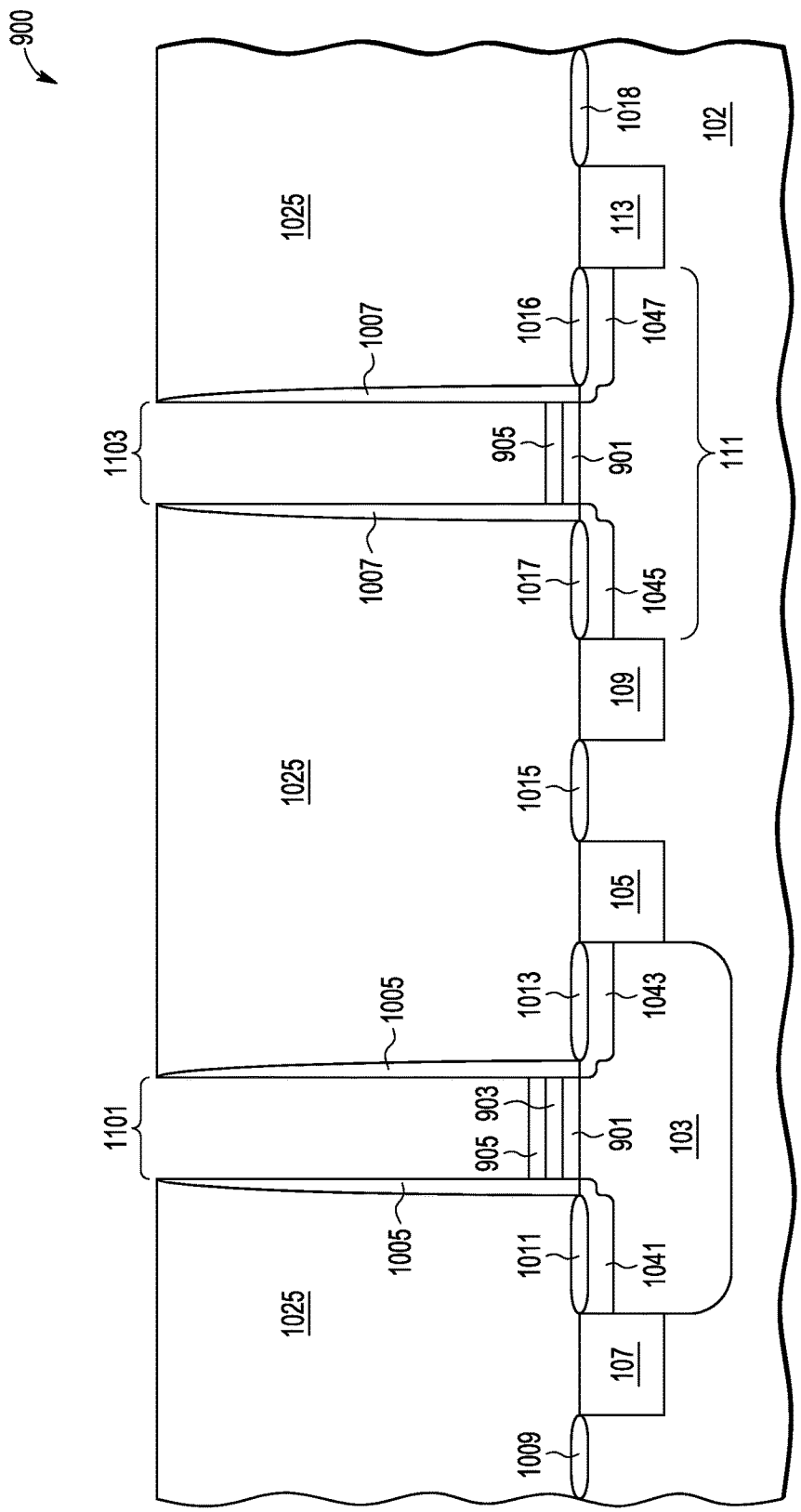

FIG. 11 shows wafer 900 after layer 1025 has been planarized down to the tops of gate structures 1001 and 1003 and the gate structures 1001 and 1003 have been removed to create openings 1101 and 1103 at the volumes of wafer 900 previously occupied by gate structures 1001 and 1003.

Figure 12:
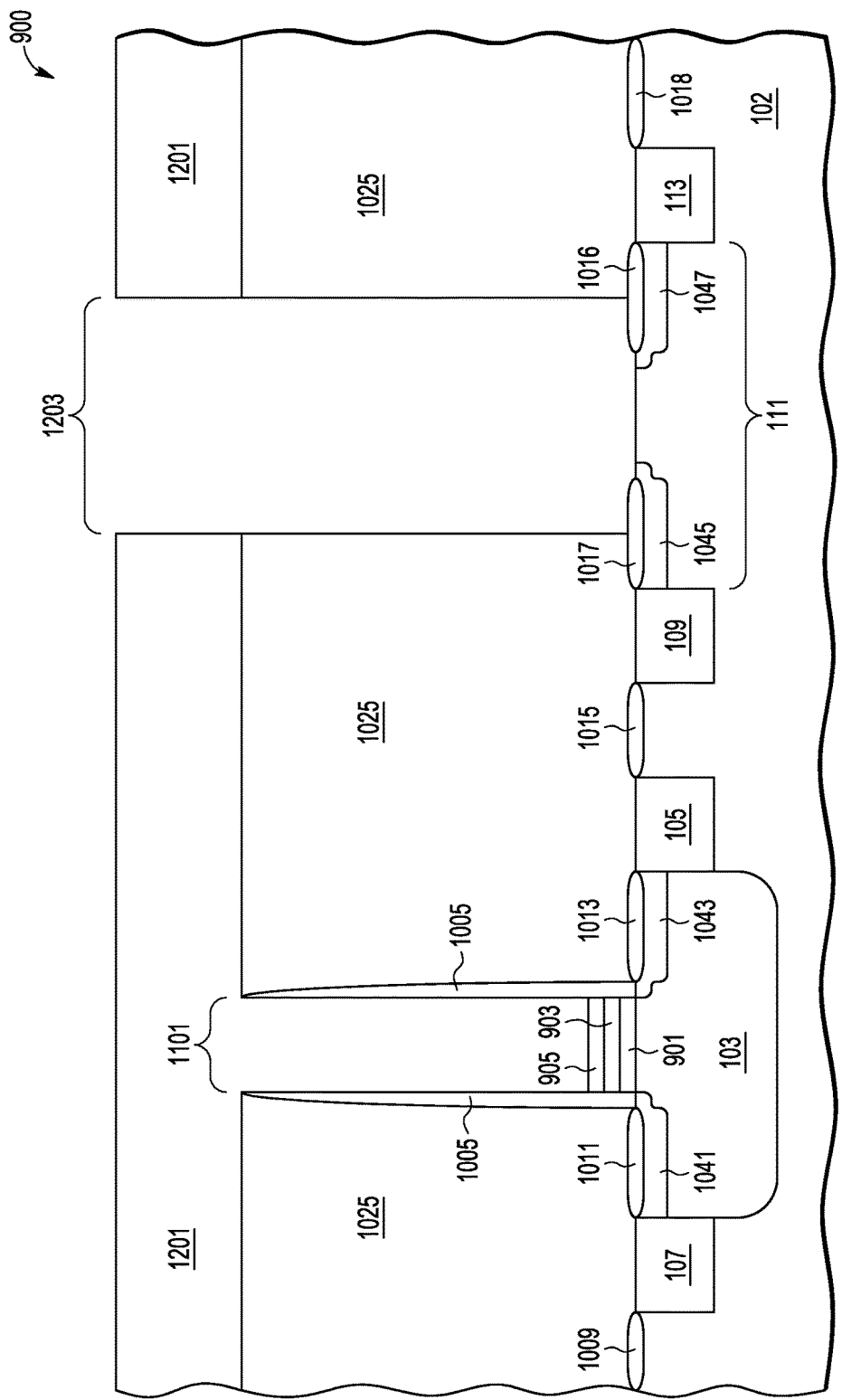

FIG. 12 shows a partial cutaway side view of wafer 900 after a layer of photoresist layer 1201 is patterned to form opening 1203 and the material of layer 1025, spacer 1007, layer 905, and gate dielectric layer 901 are removed in the opening to expose silicide structures 1017 and 1016 and substrate 102. In some embodiments, the portions of structures 1017 and 1016 are removed in opening 1203 as well.

Figure 13:
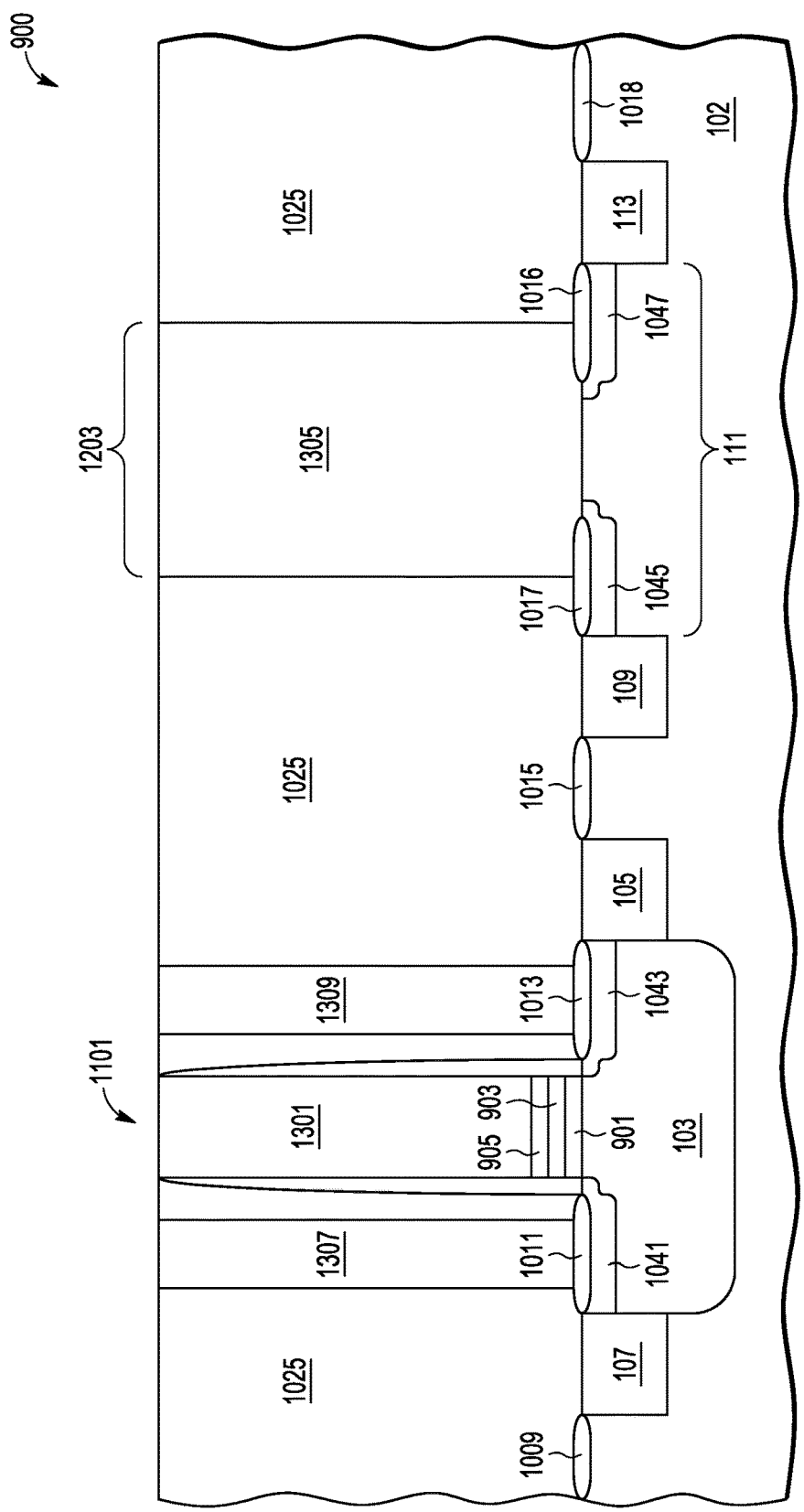

FIG. 13 is a partial cutaway side view of wafer 900 after metal gate structure 1301 is formed in the volume of opening 1101 and metal contact 1305 is formed in the volume of opening 1203. Also shown in FIG. 13 are current electrode contacts 1307 and 1309, which can be formed of the same material or a different conductive material. In one embodiment, the openings for contacts 1307 and 1309 are formed in layer 1201 with the same mask as opening 1203. In one embodiment, etching to remove the gate dielectric with the same mask used to form the current terminal contacts 1307 and 1309 may allow for the gate dielectric layer 901 to be removed from under the volume of wafer 900 that was occupied by gate structure 1003 without incurring an additional mask step. In addition, with the embodiment of FIG. 13, the cross-sectional area of the substrate contact 1305 may be greater than the area of gate structure 1003.

Figure 14:
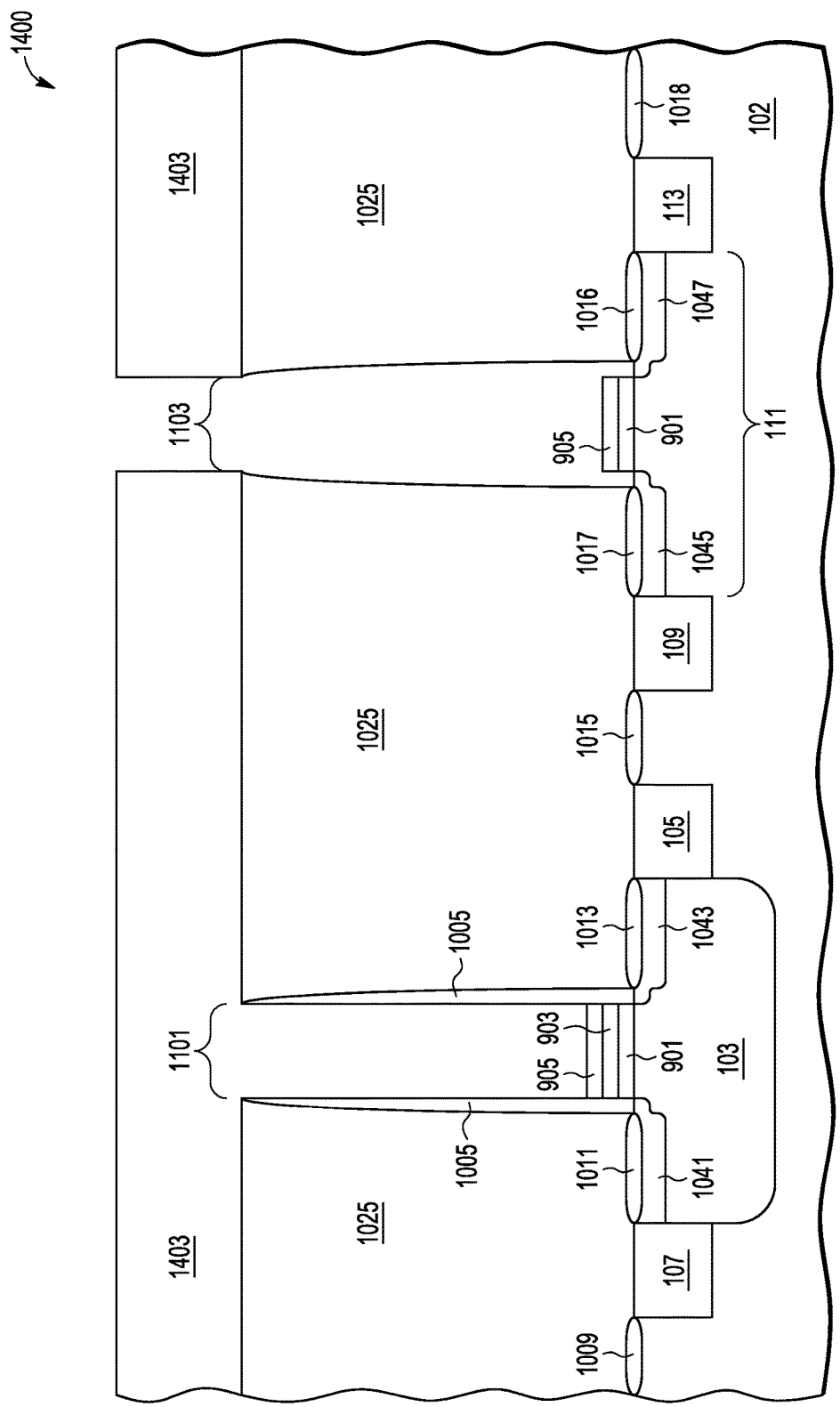
FIGS. 14-16 are partial cross-sectional side views of a wafer at various stages during the manufacture of a transistor according to another embodiment of the present invention.
Figure 15:
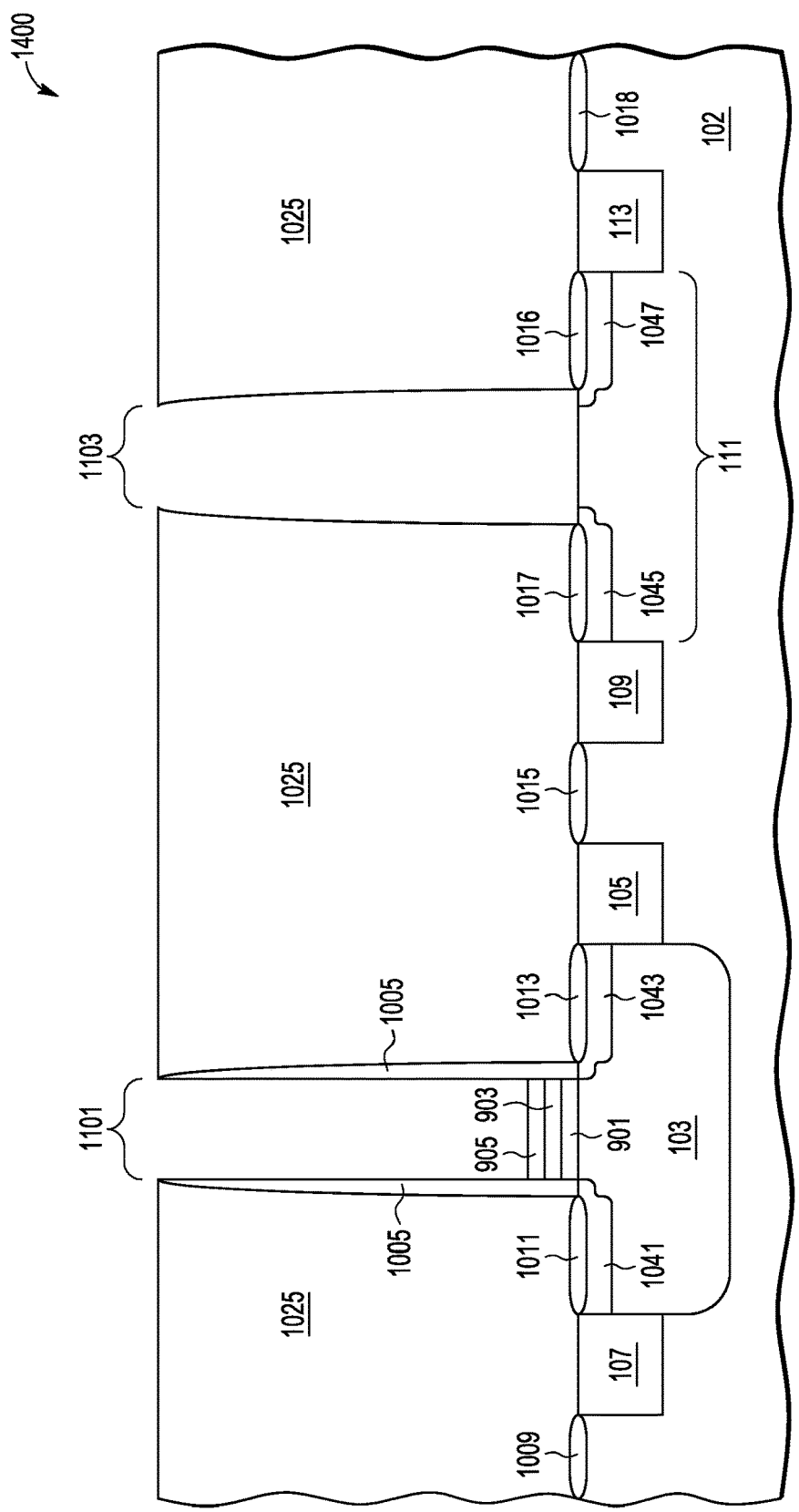
Figure 16:
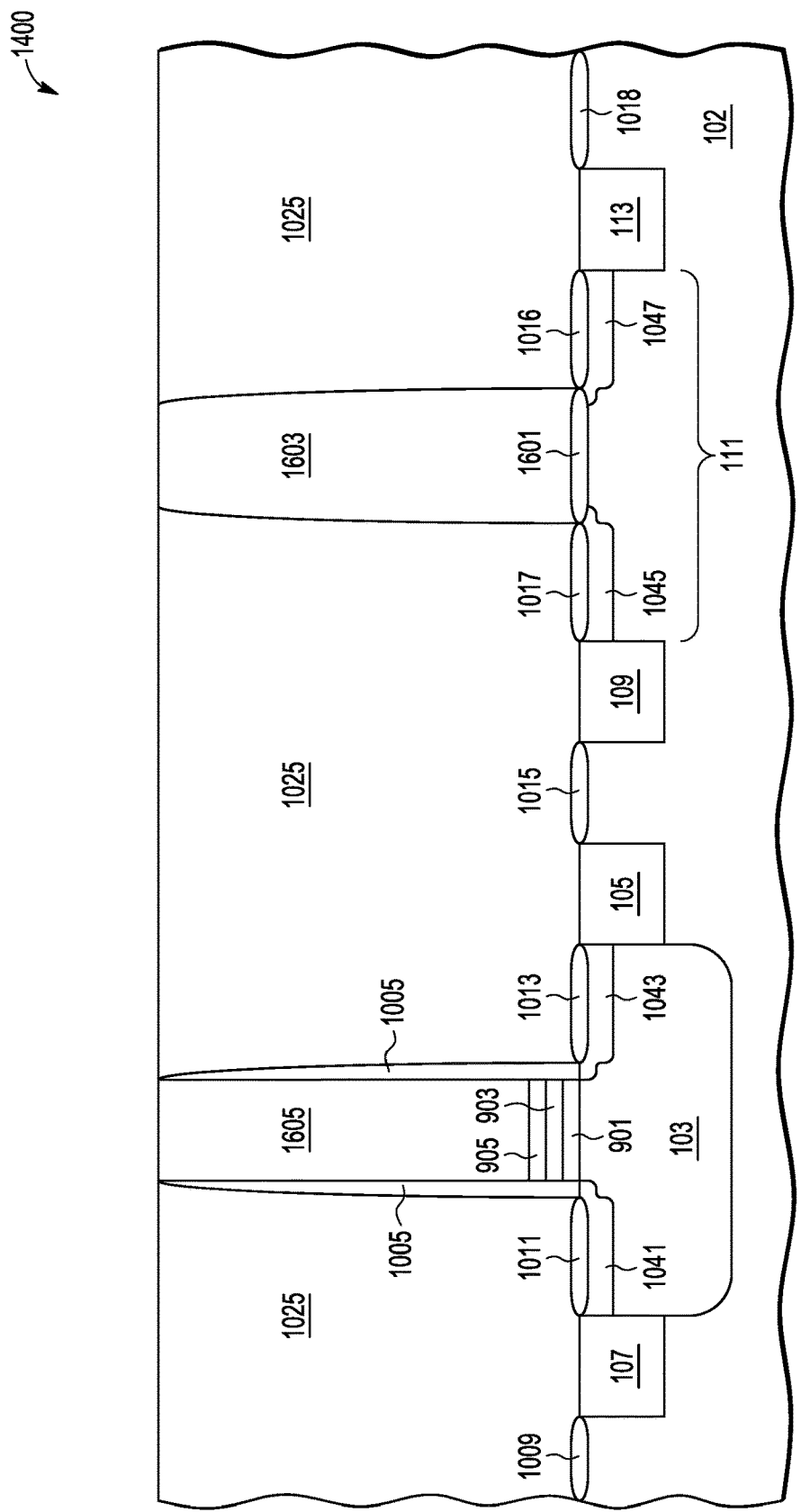

FIGS. 14-16 are partial cutaway side views of another embodiment of the present invention. The structures in the embodiments of 14-16 and the embodiments of FIGS. 9-13 that have the same numbers are similar structures and may be formed in a similar manner.

In the embodiments of FIGS. 14-16, the stage after FIG. 14 occurs after the stage of FIG. 11. As shown in FIG. 14, after the stage of FIG. 11, a patterned mask 1403 is formed over wafer 1400 with an opening to expose opening 1103. Spacer 1007 is then etched with an isotropic etchant to that removes the nitride of spacer 1007 and leaves dielectric layer 1025 intact as well as leaving layers 905 and 901 intact.

FIG. 15 shows wafer 1400 after layers 905 and 901 are removed with the appropriate etch chemistries. Also, mask 1403 has been removed as well.

FIG. 16 shows a view after the replacement gate metal is deposited in the volumes of the openings 1101 and 1103 of wafer 1400 to form a metal gate structure 1605 and substrate contact structure 1603. In one embodiment, a metal (e.g. titanium, cobalt, nickel, platinum, and tungsten, or a combination of layers including Al, Cu, W, Ni) is deposited over wafer 1400 and planarized to the top of layer 1025. Also in the embodiment shown, a silicide structure 1601 is formed prior to the deposition of the metal of structure 1603 to provide better ohmic contact with substrate 102. With the embodiment of FIG. 16, the removal of spacer 1007 provides more surface area for ohmic contact with substrate 102.

Figure 17:
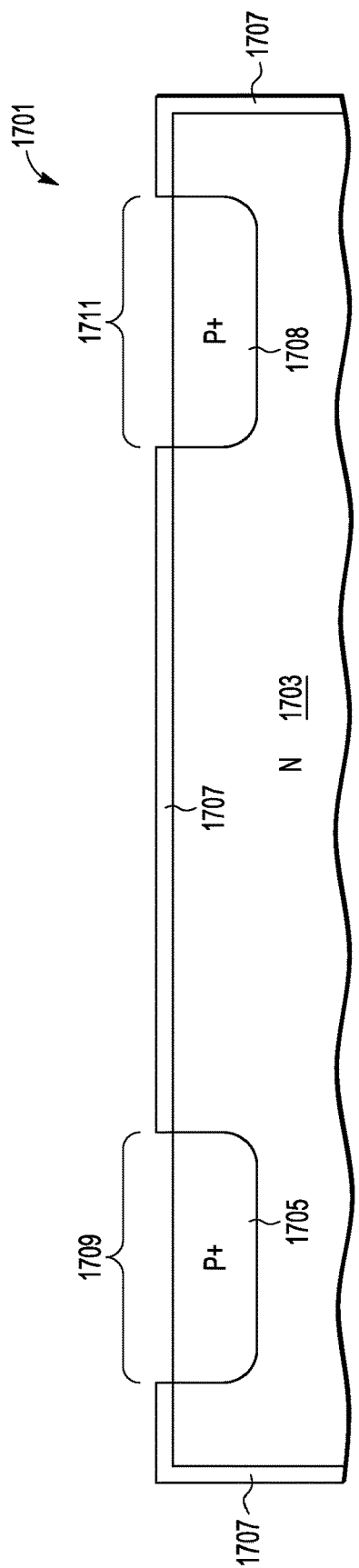
FIGS. 17-18 are partial cross-sectional side views of a wafer at various stages during the manufacture of a transistor according to another embodiment of the present invention.
Figure 18:
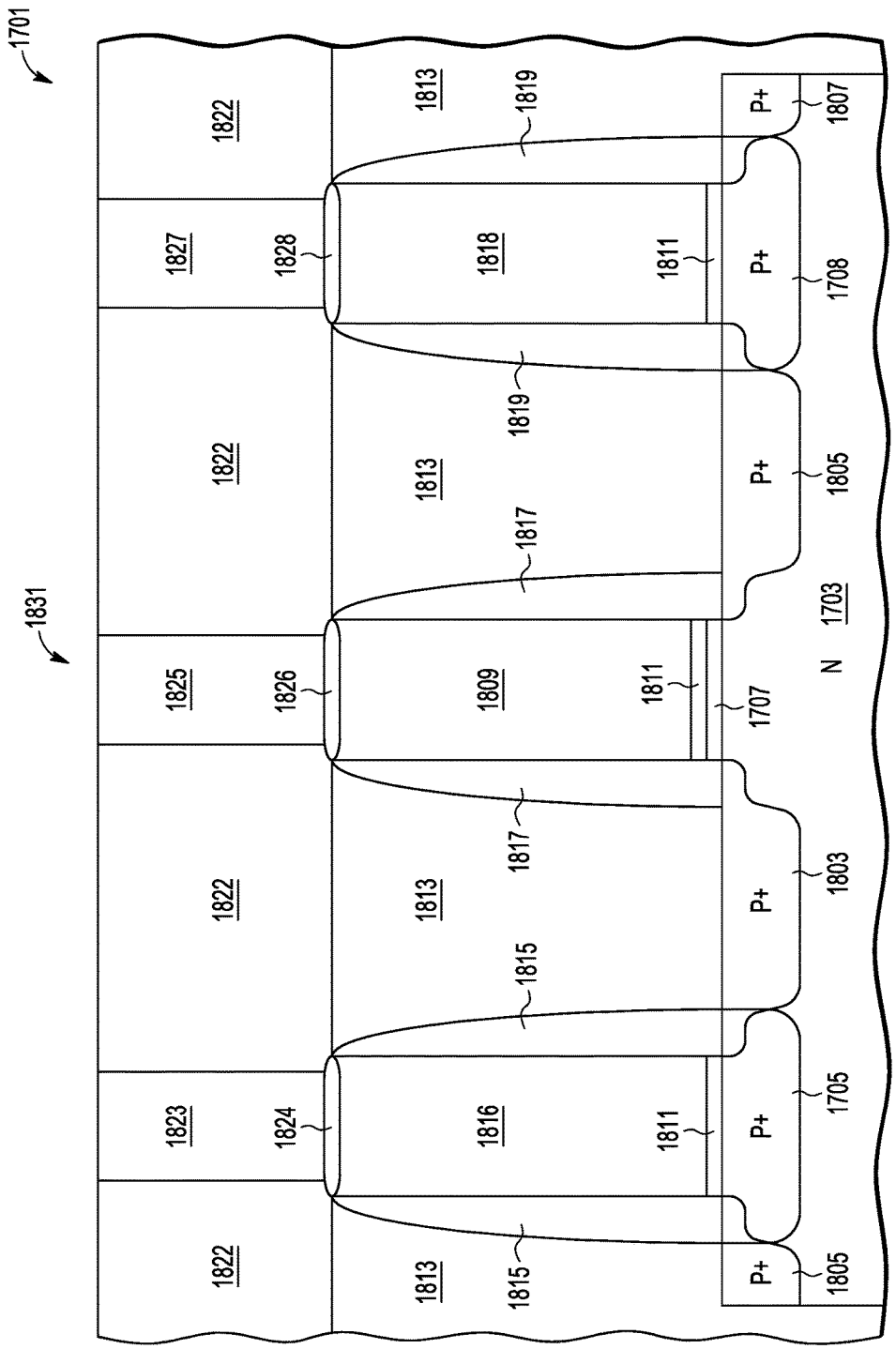

FIGS. 17 and 18 set forth partial cross sectional side views of a wafer 1701 during the manufacture of a transistor according to another embodiment. In the embodiment of FIG. 17, the substrate of wafer 1701 includes a semiconductor fin 1703 that is made of a doped semiconductor material (e.g. silicon). In one embodiment, fin 1703 is part of a bulk silicon substrate. In other embodiments, fin 1703 is located on top of a dielectric layer (not shown) of an SOI wafer. In some embodiments, fin 1703 is doped with an N-type dopant (Phosphorous, Arsenic) for a P-channel transistor, although it may be doped with P-type dopants for an N-channel transistor. However, in other embodiments, the fin is not doped with dopants in the channel region where the transistor VTs are set by the work function layers.

A layer 1707 of gate dielectric (e.g. hafnium oxide) is formed on fin 1703. Openings 1709 and 1711 are formed in layer 1707 by etching with a patterned mask (not shown). Current terminal dopants (e.g. boron) are implanted through the openings to form regions 1705 and 1708. In one embodiment, boron is implanted at an energy of 0.1–10 keV and a dosage of 5E14-5E15/cm2, but may be implanted at other energies and or dosages in other embodiments.

FIG. 18 shows a partial cutaway side view of wafer 1701 at another stage in its manufacture. After the stage of FIG. 17, a work function-adjustment metal layer 1811 (e.g. TiN) is formed over fin 1703. A layer of gate material (e.g. polysilicon, metal) is formed over wafer 1701, including over fin 1703. The layer of gate material is then patterned to form gate structure 1809 and current terminal contact structures 1816 and 1818.

Figure 19:
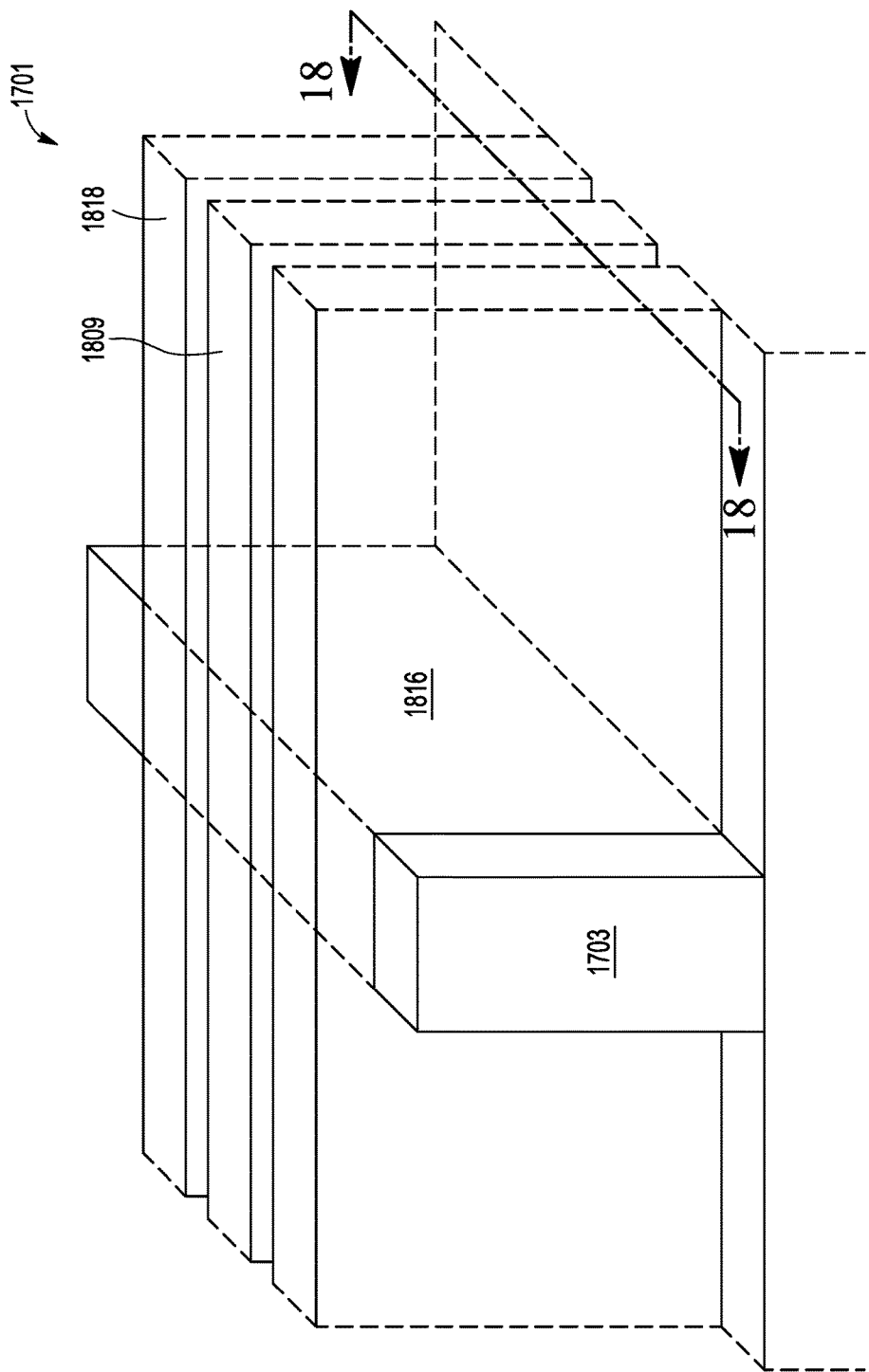
FIG. 19 is a partial perspective view of a wafer at a stage in the manufacture of a transistor according to another embodiment of the present invention.

FIG. 19 shows a partial cutaway perspective view of wafer 1701 showing how gate structure 1809 and current terminal contact structures 1816 and 1818 include length portions that run in a direction parallel with each other over fin 1703. In the partial view of FIG. 19, structures 1809, 1816, and 1818 have lengths that are of a greater size than their widths (the dimension shown in FIG. 18). FIG. 19 only shows one fin 1703, however, a transistor may include multiple fins located in parallel with each other where gate structure 1809 and contact structures 1816 and 1818 extend over the multiple fins. Not shown in FIG. 19 are work function layer 1811 or gate dielectric layer 1707.

Referring back to FIG. 18, gate structure 1809 and contact structures 1816 and 1818 have a width in the range of 7 nm to 90 nm, but may be of other dimensions in other embodiments. Structures 1816 and 1818 also serve as proximity gate structures for gate structure 1809, which may be useful for smaller manufacturing geometries.

Spacers (e.g. silicon nitride) 1815, 1817, and 1819 are formed for contact structure 1816, gate structure 1809, and contact structure 1818, respectively. Afterwards, current terminal regions 1803 and 1805 are implanted with P+ dopants to form current terminal regions 1803 and 1805. In one embodiment, the doping concentration and implantation energy for forming regions 1803 and 1805 is the same as those for forming regions 1705 and 1708. However, in other embodiments, the energies and/or doping concentrations may be different.

In the embodiment shown, structure 1809 is part of the gate (along with layer 1811) for transistor 1831. Structure 1816 is part of a source contact (along with layer 1811), and structure 1818 is part of drain contact (along with layer 1811). Region 1705 electrically connects the source contact (1816 and 1811) with source region 1803. Region 1708 electrically connects the drain contact (1818 and 1811) with drain region 1805.

After the formation of spacers 1815, 1817, and 1819, dielectric layer 1813 is formed over wafer 1701 and planarized to expose structures 1816, 1809, and 1818. Silicide structures 1824, 1826, and 1828 are then formed on structures 1816, 1809, and 1818, respectively. Afterwards, interconnect dielectric layer 1822 is formed on wafer 1701. Openings are formed in layer 1822, wherein a conductive material (e.g. copper, tungsten, aluminum, or gold) is deposited in the openings and polished to form interconnects 1823, 1825, and 1827. Although FIG. 18 shows that interconnects 1823, 1825, and 1827 are located directly above structures 1816, 1809, and 1818 over fin 1703 in the cross-sectional view of FIG. 18, in other embodiments, those interconnects maybe located at other areas of the integrated circuit (e.g. at the end portions of structures 1816, 1809, and 1818) away from fin 1703.

As shown in the embodiments of FIGS. 17-19, the proximity gate structures (1816 and 1818) that are useful for improving manufacturability (especially at smaller nodes) are also used as part of the source and drain contacts. With such a configuration, the number of process steps can be reduced as well as the area of wafer 1701 needed for transistor 1831 can be reduced as well. With some prior art arrangements, the dummy gate structures and source/drain contacts are located in different rows or columns, which requires a transistor to be more spread out.

Figure 20:
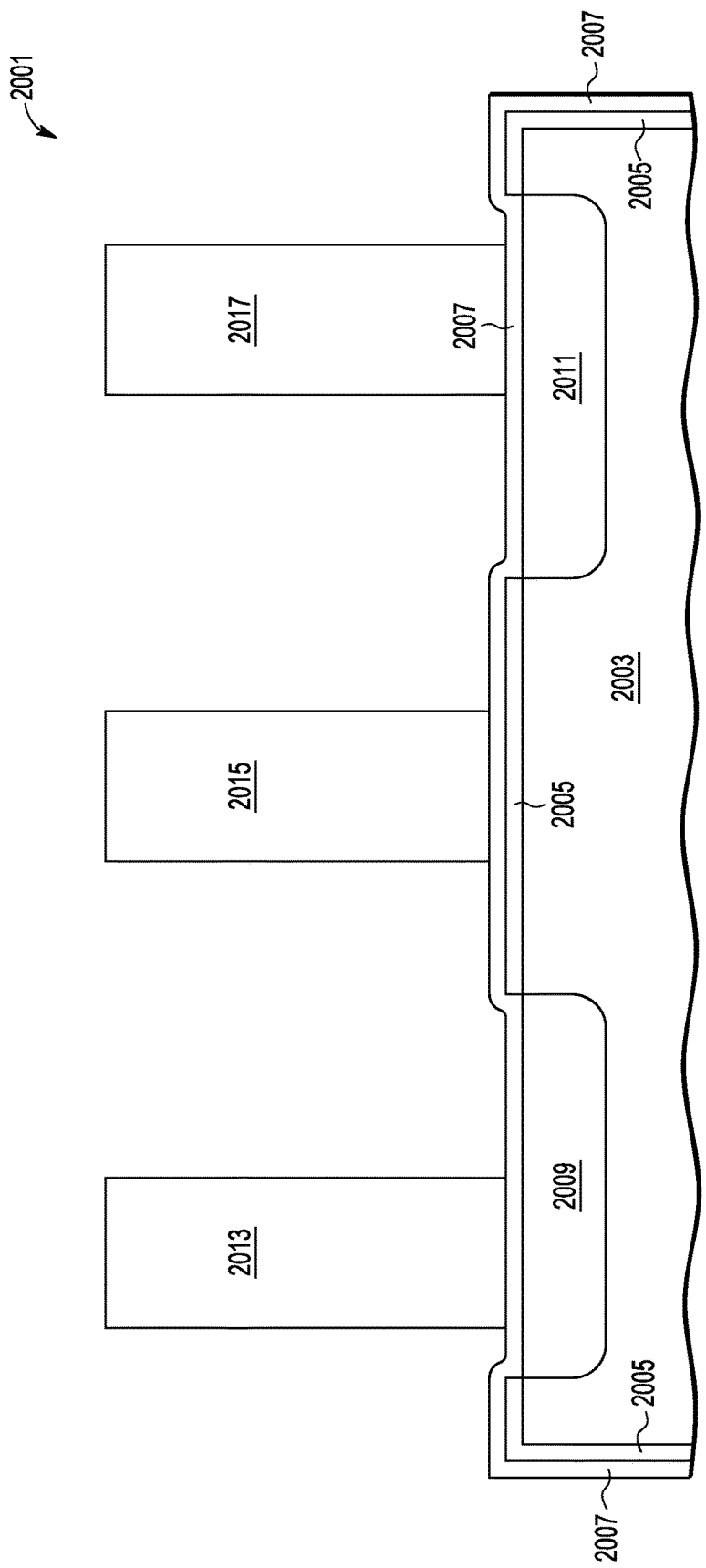
FIGS. 20-21 are partial cross-sectional side views of a wafer at various stages during the manufacture of a transistor according to another embodiment of the present invention.
Figure 21:
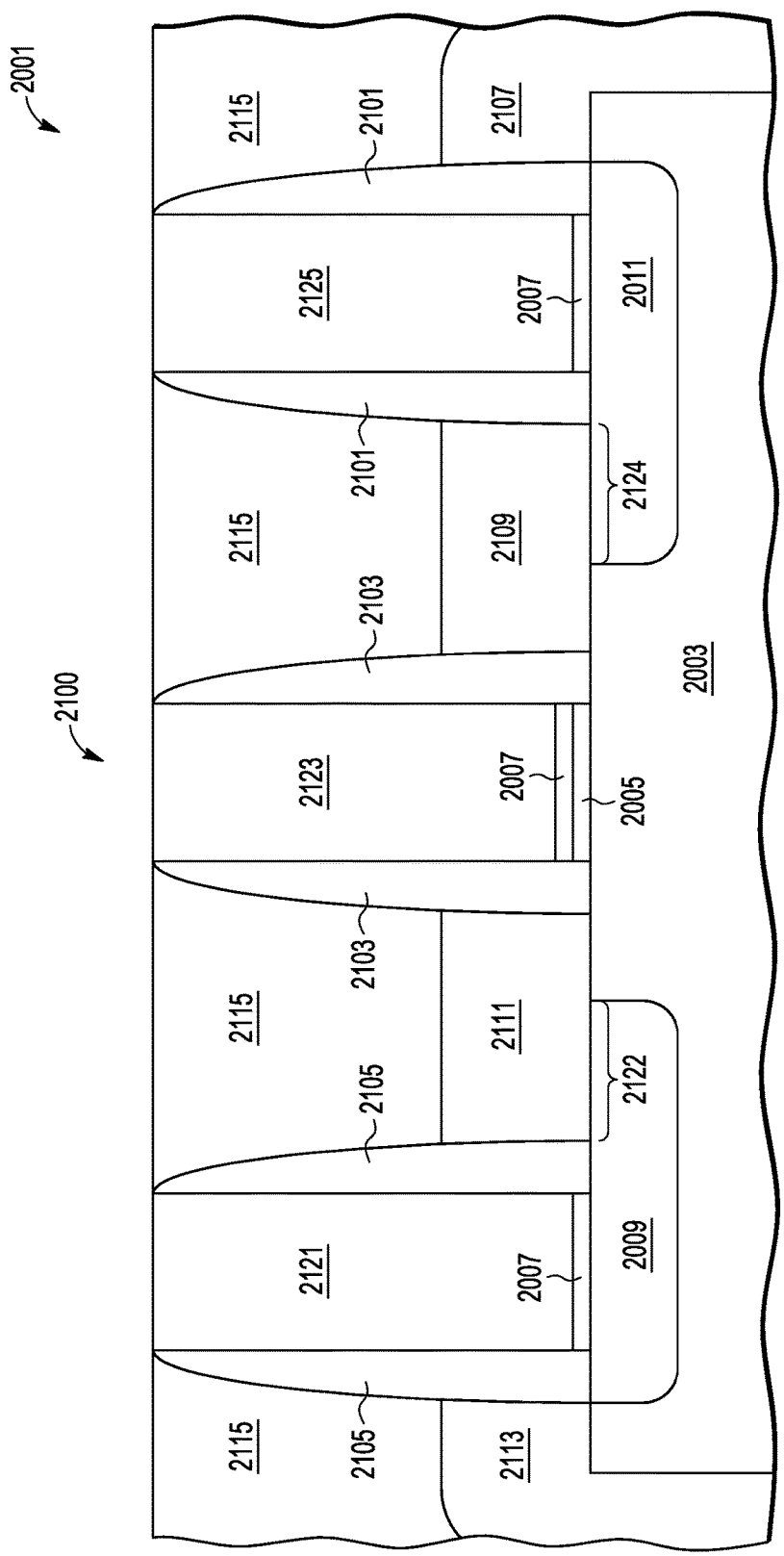

FIGS. 20 and 21 are partial cutaway side views of various stages of another embodiment of the present invention. With the embodiment of FIGS. 20 and 21, replacement gate metal is utilized for the gate, source contact, and drain contact.

Wafer 2001 includes a semiconductor fin 2003 that in some embodiments is doped with a channel dopant (either P-type or N-type depending upon the type of transistor), but may be undoped in other embodiments. Gate dielectric layer 2005 is located on fin 2003. Openings are formed in layer 2005 by etching through the openings in a patterned mask (not shown) wherein current terminal dopants are implanted through the patterned mask to form regions 2009 and 2011. Regions 2009 and 2011 have a conductivity doping that is opposite of fin 2003 in embodiments where fin 2003 is doped with channel dopants.

Afterwards, a layer of gate material (e.g. polysilicon) is formed over wafer 2001. The layer is patterned to form gate structures 2013, 2015, and 2017. In one embodiment, these gate structures have a width of 7- 90 nm, but may be of other widths in other embodiments. In one embodiment, the gate structures are spaced apart from each other by a distance 0.04-0.1 um that enables a more accurate optical patterning, etching, and CMP planarity. However, the spacings may be of other dimensions in other embodiments. See FIG. 19 for as an example of an orientation of the gate structures 2013, 2015, and 2017 with respect to fin 2003.

FIG. 21 shows wafer 2001 at a subsequent stage. After the stage of FIG. 20, spacers 2105, 2103, and 2101 are formed for gate structures 2013, 2015, and, 2017, respectively. Afterwards, wafer 2001 is subject to an epitaxial process wherein current terminal structures 2111 and 2109 (along with structures 2113 and 2017) are grown on fin 2003. In some embodiments, these structures 2111 and 2109 are grown in-situ doped with a current terminal dopant that is the same type as regions 2009 and 2011. In one embodiment, structure 2111 serves as a source region and structure 2109 serves as the drain region for transistor 2100.

After the formation of structures 2113, 2111, 2109, and 2107, an interlayer dielectric layer 2115 is formed over wafer 2001. The layer is polished back to the top surface of gate structures 2013, 2015, and 2017 (not shown in FIG. 21).

Afterwards, gate structures 2013, 2015, and 2017 are removed. Metal is deposited in the volumes of wafer 2001 where gate structures 2013, 2015, and 2017 were removed from to form structures 2121, 2123, and 2125.

Gate structure 2123 is part of the gate for transistor 2100, contact structure 2121 is part of the source terminal contact for transistor 2100, and contact structure 2125 is part of the drain terminal contact for transistor 2100. Structure 2121 is electrically coupled to source region structure 2111 through layer 2007 and region 2009. Structure 2125 is electrically coupled to drain region structure 2109, through layer 2007, and region 2011. As shown in FIG. 21, region 2009 is contiguous to epitaxially grown fin structure 2111 in area 2122 and region 2011 is contiguous to epitaxially grown fin structure 2019 in area 2124. The size of areas 2122 and 2124 can be set as per the desired conductivity. In some embodiments, base fin 2003 can be implanted with current terminal conductivity dopants that extend underneath spacers 2103.

In other embodiments, the gate dielectric layer 2005 (see FIG. 20) may be removed after the removal of gate structures 2013, 2015, and 2017 and before the formation of structures 2121, 2123, and 2125.

Features shown or described herein with respect to one embodiment may be implemented with other embodiments shown or described herein. For example, the processes, features, and/or structures shown or described with respect to the embodiments of FIGS. 17-21 of a FinFET transistor may be utilized with embodiments of a planar transistor shown in FIGS. 1-16, and vice versa.

As disclosed herein, a first structure (or region) is "directly above" a second structure (or region) if the first structure is located above the second structure in a line having a direction that is perpendicular with the generally planar major side of the wafer. For example, in FIG. 4, gate structure 405 is directly above region 103. Gate structure 407 is not directly above region 103. As disclosed herein, a first structure (or region) is "directly beneath" a second structure (or region) if the first structure is located beneath the second structure in a line having a direction that is perpendicular with the generally planar major side of the wafer. For example, in FIG. 4, region 103 is directly beneath gate structure 405. Region 103 is not directly beneath gate structure 407. As disclosed herein, a first structure (or region) is "directly between" a second structure (or region) and a third structure (or region) if the first structure is located between the second structure and third structure in a line having a direction that is parallel with the generally planar major side of the wafer.

In one embodiment, a method of forming a transistor includes forming a layer of gate dielectric material over a substrate of a wafer, forming a layer of gate material over the layer of gate dielectric material, and patterning the layer of gate material to form a first gate structure and a second gate structure. The first gate structure occupies a first volume of the wafer and the second gate structure occupies a second volume of the wafer. The method includes forming a first sidewall spacer for the first gate structure and a second sidewall spacer for the second gate structure and removing the gate dielectric material from an area of the wafer. The first volume of the wafer is directly above the area. A substrate contact includes at least a portion located in the first volume. A gate of a transistor includes at least a portion located in the second volume.

In another embodiment, a method of forming a transistor includes forming a layer of gate material over a substrate of a wafer. A layer of gate dielectric material is located between the substrate and the layer of gate material in at least a first area of the wafer. The method includes patterning the layer of gate material to form a first gate structure, a second gate structure, and a third gate structure. The first gate structure is located in the first area. The first gate structure occupies a first volume of the wafer. The second gate structure occupies a second volume of the wafer, and the third gate structure occupies a third volume of the wafer. The method includes forming a first sidewall spacer for the first gate structure, a second sidewall spacer for a second gate structure, and a third sidewall spacer for the third gate structure. A gate of the transistor includes at least a portion located in the first volume. A first current terminal contact of the transistor includes at least a portion located in the second volume. A second current terminal contact of the transistor includes at least a portion located in the third volume.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A method of forming a transistor, comprising:
   forming a layer of gate dielectric material over a substrate of a wafer;
   forming a layer of gate material over the layer of gate dielectric material;
   patterning the layer of gate material to form a first gate structure and a second gate structure, the first gate structure occupies a first volume of the wafer and the second gate structure occupies a second volume of the wafer;
   forming a first sidewall spacer for the first gate structure and a second sidewall spacer for the second gate structure;
   removing the gate dielectric material from an area of the wafer, the first volume of the wafer is directly above the area;
   wherein a substrate contact includes at least a portion located in the first volume, wherein a gate of a transistor includes at least a portion located in the second volume.

2. The method of claim 1 wherein the substrate contact is characterized as a current terminal region contact of the transistor.

3. The method of claim 1 wherein:
   the patterning includes forming a third gate structure that occupies a third volume of the wafer;
   the forming the first sidewall spacer for the first gate structure and the second sidewall spacer for the second gate structure further includes forming a third sidewall spacer for the third gate structure;
   the removing the layer of gate dielectric material includes removing the layer of gate dielectric material from a second area of the wafer, the third volume of the wafer is directly above the second area;
   wherein a second substrate contact includes at least a portion located in the third volume.

4. The method of claim 3 wherein the substrate contact is characterized as a first current terminal region contact of the transistor and the second substrate contact is characterized as a second current terminal region contact of the transistor.

5. The method of claim 4 wherein a first current terminal region of the transistor, a second current terminal region of the transistor, and a channel region of the transistor are located in a semiconductor fin structure of the wafer.

6. The method of claim 1 further comprising:
   growing epitaxial semiconductor material on a substrate of the wafer after the patterning, wherein a first current terminal region of the transistor and a second current terminal region of the transistor each include a portion of the epitaxial semiconductor material.

7. The method of claim 1 wherein the removing the layer of gate dielectric material from the area of the wafer is performed prior to the forming the layer of gate material over the layer of gate dielectric material.

8. The method of claim 1 wherein the removing the layer of gate dielectric material from the area of the wafer is performed after the forming a layer of gate material over the layer of gate dielectric material.

9. The method of claim 1 further comprising:
   after forming the first sidewall spacer for the first gate structure and the second sidewall spacer for the second gate structure, removing the first gate structure and the second gate structure;
   after the removing the first gate structure and the second gate structure, forming a metal material in the first volume and in the second volume, wherein the substrate contact includes the metal material in the first volume, wherein the gate of the transistor includes the metal material in the second volume.

10. The method of claim 9 further comprising:
    removing the first sidewall spacer wherein the forming the metal material includes forming the metal material in a volume of the first sidewall spacer after the removal of the first sidewall spacer.

11. The method of claim 1 wherein the substrate contact includes the first gate structure, wherein the gate of a transistor includes the second gate structure.

12. The method of claim 1 wherein after the forming the layer of gate dielectric material, forming a layer of metal material over the layer of gate dielectric material, wherein the layer of gate material is formed over the layer of metal material.

13. A method of forming a transistor, comprising:
    forming a layer of gate material over a substrate of a wafer, wherein a layer of gate dielectric material is located between the substrate and the layer of gate material in at least a first area of the wafer;
    patterning the layer of gate material to form a first gate structure, a second gate structure, and a third gate structure, the first gate structure is located in the first area, the first gate structure occupies a first volume of the wafer, the second gate structure occupies a second volume of the wafer, and the third gate structure occupies a third volume of the wafer;

forming a first sidewall spacer for the first gate structure, a second sidewall spacer for a second gate structure, and a third sidewall spacer for the third gate structure;

wherein a gate of the transistor includes at least a portion located in the first volume, a first current terminal contact of the transistor includes at least a portion located in the second volume; a second current terminal contact of the transistor includes at least a portion located in the third volume.

14. The method of claim 13 wherein the first gate structure, the second gate structure, and the third gate structure each include portions that run along a length that has a dimension that is bigger than a width of the portions and each portion is located parallel to the other portions along the length.

15. The method of claim 13 wherein a first current region, a second current region, and a channel region of the transistor are located in a semiconductor fin of the wafer, the first gate structure, the second gate structure, and the third gate structure each include a portion located directly above the semiconductor fin.

16. The method of claim 13 wherein prior to the forming the layer of gate material, implanting current terminal doping material into a second area of the wafer located directly beneath the second volume and a third area of the wafer located directly beneath the third volume.

17. The method of claim 16 further comprising:
forming a layer of gate dielectric material in the first area, in the second area, and in the third area;

removing the layer of gate dielectric material in the second area and in the third area.

18. The method of claim 13 further comprising:
removing the first gate structure, the second gate structure, and the third gate structure;
after the removing, forming metal material in the first volume, in the second volume, and in the third volume;
wherein the gate of the transistor includes the metal material located in the first volume, the first current terminal contact of the transistor includes the metal material located in the second volume; and the second current terminal contact includes the metal material in the third volume.

19. The method of claim 13 further comprising:
epitaxially growing a first semiconductor structure directly between the first sidewall spacer and the second sidewall spacer, a first current terminal region of the transistor includes at least a portion of the first semiconductor structure;
epitaxially growing a second semiconductor structure directly between the first sidewall spacer and the third sidewall spacer, a second current terminal region of the transistor includes at least a portion of the second semiconductor structure.

20. The method of claim 13 wherein the gate of the transistor includes the first gate structure, the first current terminal contact of the transistor includes the second gate structure, and the second current terminal contact includes the third gate structure.

* * * * *